United States Patent
Zia et al.

(10) Patent No.: US 7,785,983 B2
(45) Date of Patent: Aug. 31, 2010

(54) SEMICONDUCTOR DEVICE HAVING TILES FOR DUAL-TRENCH INTEGRATION AND METHOD THEREFOR

(75) Inventors: Omar Zia, Austin, TX (US); Ruiqi Tian, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 539 days.

(21) Appl. No.: 11/683,236

(22) Filed: Mar. 7, 2007

(65) Prior Publication Data

US 2008/0217714 A1    Sep. 11, 2008

(51) Int. Cl.
*H01L 21/76* (2006.01)
*H01L 21/336* (2006.01)

(52) U.S. Cl. ............... 438/427; 438/296; 438/424; 257/E21.548

(58) Field of Classification Search ........... 438/427, 438/296, 424; 257/E21.548
See application file for complete search history.

(56) References Cited

U.S. PATENT DOCUMENTS

| | | | | |
|---|---|---|---|---|
| 5,759,744 A * | 6/1998 | Brueck et al. | ........ | 430/312 |
| 5,925,494 A * | 7/1999 | Horn | ........ | 430/270.1 |
| 6,268,907 B1 * | 7/2001 | Samuels et al. | ........ | 355/71 |
| 6,399,273 B1 * | 6/2002 | Yamada et al. | ........ | 430/270.1 |
| 6,432,609 B1 * | 8/2002 | Liu | ........ | 430/270.1 |
| 6,556,277 B2 | 4/2003 | Pierrat | | |
| 6,905,967 B1 | 6/2005 | Tian et al. | | |
| 7,067,342 B2 | 6/2006 | Zia et al. | | |
| 7,109,051 B2 | 9/2006 | Cave et al. | | |
| 7,524,591 B2 | 4/2009 | Hosono | | |
| 2003/0194657 A1 * | 10/2003 | Renaldo et al. | ........ | 430/315 |
| 2005/0133832 A1 | 6/2005 | Murthy et al. | | |
| 2005/0191822 A1 * | 9/2005 | Liu | ........ | 438/424 |

OTHER PUBLICATIONS

Quirk, Michael and Julian Serda, Semiconductor Manufacturing Technology, pp. 339-341, Prentice Hall, 2001.*

* cited by examiner

*Primary Examiner*—Matthew C Landau
*Assistant Examiner*—Daniel Luke
(74) *Attorney, Agent, or Firm*—Daniel D. Hill

(57) ABSTRACT

A method for forming a semiconductor device includes providing a semiconductor substrate having a first region and a second region. The first region has one or more first elements and the second region has one or more second elements. The first elements are different from the second elements. A tile location and a first tile surface area for a tile feature on the semiconductor device is defined. An active semiconductor layer is formed over both the first region and the second region of the semiconductor substrate. A first trench is formed in the active semiconductor layer at the tile location using a negative tone mask. The first trench has a first depth and forms at least a portion of the tile feature. A second trench is formed in the active semiconductor layer using a positive tone mask. The second trench has a second depth different than the first depth.

12 Claims, 9 Drawing Sheets

SEMICONDUCTOR DEVICE HAVING TILES FOR DUAL-TRENCH INTEGRATION AND METHOD THEREFOR

BACKGROUND

1. Field

This disclosure relates generally to semiconductor devices, and more specifically, to a semiconductor device having tiles for dual-trench integration and method therefor.

2. Related Art

During the manufacture of a semiconductor device, it may be necessary to planarize the surface of a semiconductor device as one or more of the manufacturing steps. Chemical Mechanical Polishing (CMP) is one such process used to planarize surfaces of semiconductor devices. However, it is difficult to guarantee uniformity of the planarization because of varying layouts on the semiconductor device. The non-uniformity in thickness, caused by interactions between the layout and the polishing process, can result in electrical opens, high resistance contacts, electrical shorts, or other leakage paths in the integrated circuits. Traditionally, tiling has been used in forming semiconductor devices to help solve the varying height problem. Tiles are printed dummy features used to fill in the low areas caused by circuitry that is less densely laid out on one portion of a semiconductor device as compared to another portion that has circuitry more densely laid out.

One type of semiconductor device includes an optical device portion and an electronic device portion. This device type may include trenches of two or more depths. One trench, a conventional Shallow Trench Isolation (STI) pattern is patterned using a negative tone mask. A second trench is patterned using a positive tone mask. The tones are opposite to prevent the two trenches from interacting. Also, the negative tone mask may have an extremely low percentage open area which may induce instability in an etched critical dimension (CD) or depth. In addition, the use of tiles may still be important for a subsequent CMP process step, an etch step, or a deposition step.

Therefore, a need exists for a way to solve the above problems.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
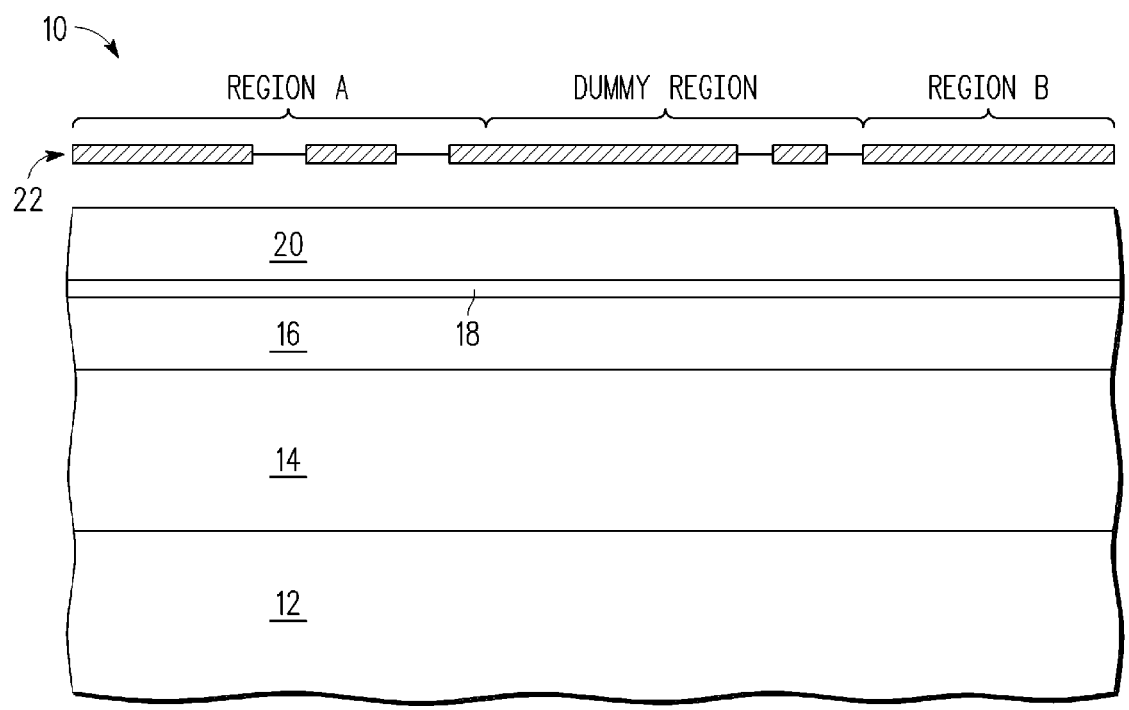
FIG. 1 illustrates a cross section of a semiconductor device structure useful for understanding a processing stage of a first embodiment.

One aspect of the illustrated embodiment includes a method for forming a semiconductor device, the method comprising providing a semiconductor substrate having a first region and a second region. The first region has one or more first elements and the second region has one or more second elements, the first elements are different from the second elements. A tile location and a first tile surface area are defined for a tile feature on the semiconductor device. An active semiconductor layer is formed over both the first region and the second region of the semiconductor substrate. A first trench is formed in the active semiconductor layer at the tile location using a negative tone photomask. The first trench has a first depth and forms at least a portion of the tile feature. A second trench is formed in the active semiconductor layer using a positive tone photomask. The second trench has a second depth that is different than the first depth. The first and second trenches are filled with a fill material. The semiconductor device is then chemical mechanical polished.

In another aspect, a method for forming a semiconductor device is provided. The method comprises providing a semiconductor substrate having an optical element region and an electronic element region. A tile feature for the semiconductor device is defined. A tile location for the tile feature on the semiconductor device is defined. An active semiconductor layer is formed over both the optical element region and the electronic element region of the semiconductor substrate. An insulating layer is formed over the active semiconductor layer. A layer comprising nitride is formed over the insulating layer. A first trench is formed in the active semiconductor layer at the tile location using a negative tone mask. The first trench has a first depth, forms at least a portion of the tile feature, and encloses a tile surface area on a surface of the semiconductor device. A second trench is formed in the active semiconductor layer using a positive tone mask. The second trench has a second depth that is deeper than the first depth. The first and second trenches are filled with a fill material. The surface of the semiconductor device is then planarized using a CMP process.

In yet another aspect, a semiconductor device is provided. The semiconductor device includes a semiconductor substrate having an optical element region and an electronic element region. An active semiconductor layer is formed over both the optical element region and the electronic element region of the semiconductor substrate. An insulating layer is formed over the active semiconductor layer. A layer comprising nitride is formed over the insulating layer. A first trench is formed in the active semiconductor layer, the insulating layer, and the layer comprising nitride at the tile location using a negative tone mask. The first trench has a first depth, forms at least a portion of a tile feature, and encloses a tile surface area on a surface of the semiconductor device. A second trench is formed in the active semiconductor layer, the insulating layer, and the layer comprising nitride using a positive tone mask. The second trench has a second depth that is deeper than the first depth. A fill material is formed in the first and second trenches.

Note that for purposes of this description, dummy features include features printed onto a semiconductor device substrate. Different types of dummy features are used in semiconductor devices for various reasons. For example, dummy bit lines may be used in memory arrays along the outermost edges to allow all the active bit lines in the array to be uniformly patterned. Unlike dummy bit lines, polishing dummy features are dummy features added at a feature level of a mask of a semiconductor device to improve polishing characteristics at the current or a subsequently formed level. Also, dummy features may be used to improve the shape or size of active features during patterning with a photomask. A polishing dummy feature is not required for the proper operation of a device. Active features are features that correspond to the designed circuitry for a semiconductor device. The active features include portions of transistors, capacitors, resistors, or the like. Active features include power supply features, which are designed to operate at a substantially constant potential, and signal features, which are designed to operate at one potential under one set of electronic conditions and a different potential at another set of electronic conditions.

The illustrated embodiments increase a percentage of open area in a negative tone mask of a dual trench manufacturing process by incorporating the dummy, or tile, features in the negative pattern generated from the negative tone mask. This improves stability of the etched critical dimension and depth. It also reduces process variations and aids CMP performance.

FIGS. 1-7 illustrate cross-sectional views of steps for making a semiconductor device 10 in accordance with a first embodiment. FIG. 1 illustrates a cross section of a semiconductor device structure 10 useful for understanding a processing stage of the first embodiment. Semiconductor device 10 includes a substrate 12, an insulating layer 14, a semiconductor layer 16, a pad oxide layer 18, and a silicon nitride layer 20. Semiconductor device 10 is divided into three regions: a first region labeled "REGION A", a second region labeled "REGION B", and a third region labeled "DUMMY REGION". Generally, REGION A refers to a portion of semiconductor device 10 that employs trenches having a first depth, REGION B refers to a portion of the semiconductor device 10 that employs trenches having a second depth, and DUMMY REGION refers to a portion of semiconductor device 10 that employs dummy features incorporating trenches. The first depth can be the same or different than the second depth. In a preferred embodiment, REGION A is an optical region and REGION B is an electronic region. For example, REGION A includes a waveguide and REGION B includes transistors. In another embodiment, REGION A can include other types of optical elements, such as for example, an optical grating coupler, an optical modulator, an optical wavelength-selective filter, or an arrayed waveguide grating. In other embodiments, REGION A and REGION B can employ other device types. For example, both regions can include optical elements, electronic elements, or a combination of optical and electronic elements. Also, the regions may include transistors of different types. For example, REGION A may have bipolar transistors and REGION B may have complementary metal-oxide semiconductor (CMOS) transistors. In addition, there may be more than one of each of regions REGION A, REGION B, and DUMMY REGION in different parts of semiconductor device 10.

In the illustrated embodiment, substrate 12 is a silicon substrate. In other embodiments, substrate 12 can be any semiconductor material or combinations of materials, such as gallium arsenide, silicon germanium, silicon-on-insulator (SOI), silicon, monocrystalline silicon, the like, and combinations of the above. Insulating layer 14 is preferably oxide about 8000 Angstroms thick. Semiconductor layer 16 is preferably monocrystalline silicon that is about 3000 Angstroms thick. Insulating layer 14 and semiconductor layer 16 together are similar to a standard semiconductor on insulator (SOI) wafer except that in this case semiconductor layer 16 is thicker than the corresponding layer in a conventional SOI wafer. Pad oxide layer 18 is formed over semiconductor layer 16 and is preferably about 90 Angstroms thick. Nitride layer 20 is formed over pad oxide layer 18 and is about 1000 Angstroms thick. Pad oxide 18 and nitride 20 are conventional layers used in preparation for trench formation.

As illustrated in FIG. 1, a negative tone photomask 22 is positioned over the surface of the semiconductor device 10. The negative tone photomask is patterned for forming a plurality of openings, or trenches, in semiconductor device 10 in accordance with a conventional shallow trench isolation (STI) process.

Figure 2:
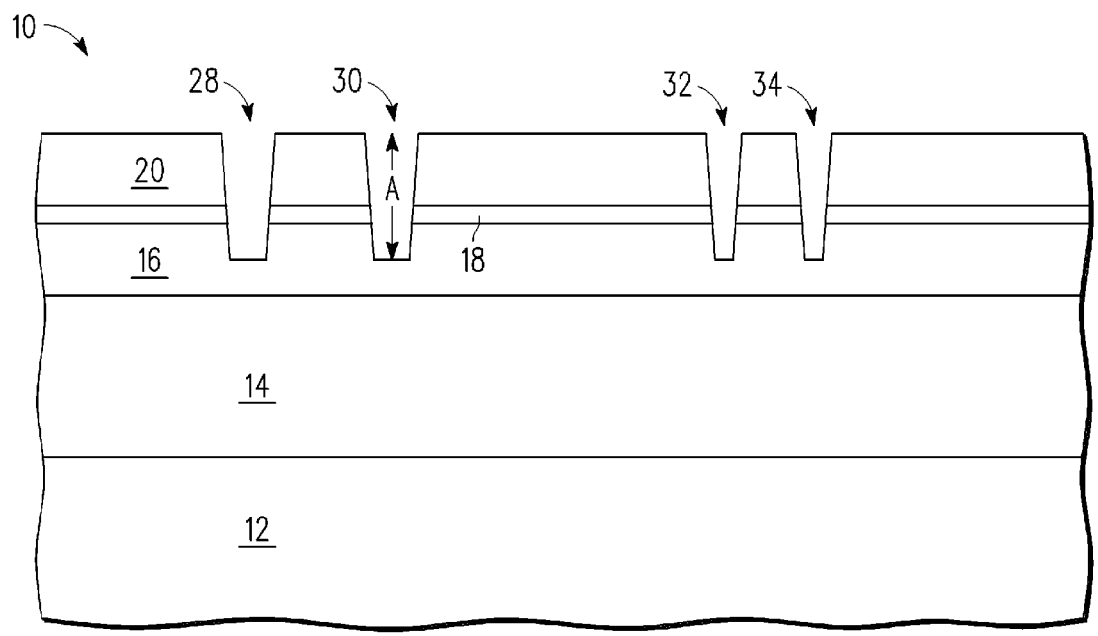
FIG. 2 illustrates a cross section of the semiconductor device structure at a subsequent processing stage.

FIG. 2 illustrates a cross section of the semiconductor device structure 10 after trenches 28 and 30 are formed in optical region REGION A, and trenches 32 and 34 are formed in region DUMMY REGION. A portion of nitride layer 20, pad oxide 18, and semiconductor layer 16 are removed to form a first plurality of trenches. Each of trenches 28, 30, 32, and 34 are formed using a conventional STI process and have a depth labeled "A" in FIG. 2. In one embodiment, depth "A" may be between about 1100-1800 Angstroms. Note that the depth of the trenches does not extend completely through semiconductor layer 16. Trenches 28 and 30 are for forming a waveguide, and trenches 32 and 34 are for forming a tile feature. The illustrated tile feature is one of a plurality of tile features that may be formed on semiconductor device 10 to improve, for example, planarity of the device after a planarizing step such as for example, CMP. In other embodiments, the depth of trenches 28, 30, 32, and 34 is selected according to particular optical device requirements.

Figure 3:
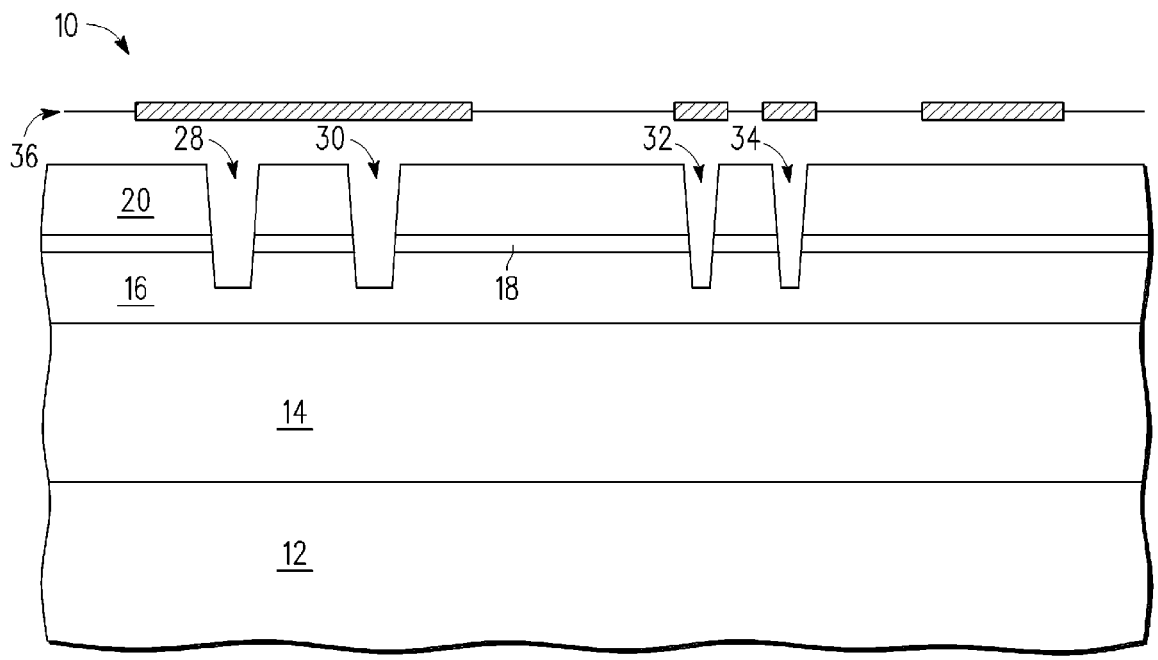
FIG. 3 illustrates a cross section of the semiconductor device structure at a subsequent processing stage.

FIG. 3 illustrates a cross section of the semiconductor device structure 10 with a positive tone photomask 36 in position for forming a second plurality of trenches. The second plurality of trenches may be formed using the same process as used for trenches 28, 30, 32, and 34, or a different process may be used.

Figure 4:
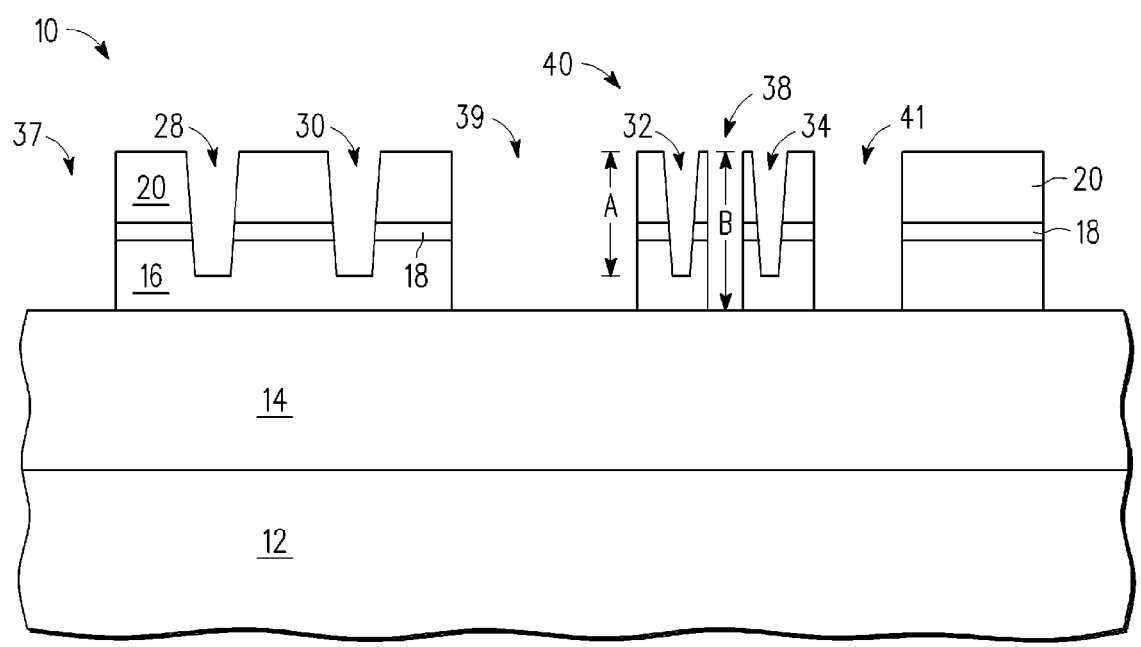
FIG. 4 illustrates a cross section of the semiconductor device structure at a subsequent processing stage.

FIG. 4 illustrates a cross section of the semiconductor device structure 10 after the second plurality of trenches are formed. Portions of nitride layer 20, pad oxide layer 18, and semiconductor layer 16 are removed to form trenches 37, 38, 39, and 41. Trenches 37, 38, 39, and 41 are etched to a second depth labeled "B" that is deeper than the first depth "A" as illustrated in FIG. 4. The etching is stopped at the top of insulating layer 14. Trenches 32, 34, and 38 together forms a tile feature 40 in region DUMMY REGION having trenches with two different depths (dual trench). As stated above, tile feature 40 is a dummy feature used to increase a percentage of open area in a negative tone photomask. More specifically, tile feature 40 functions as an etch feature to help increase stability and uniformity of etched features without harming CMP performance.

Figure 5:
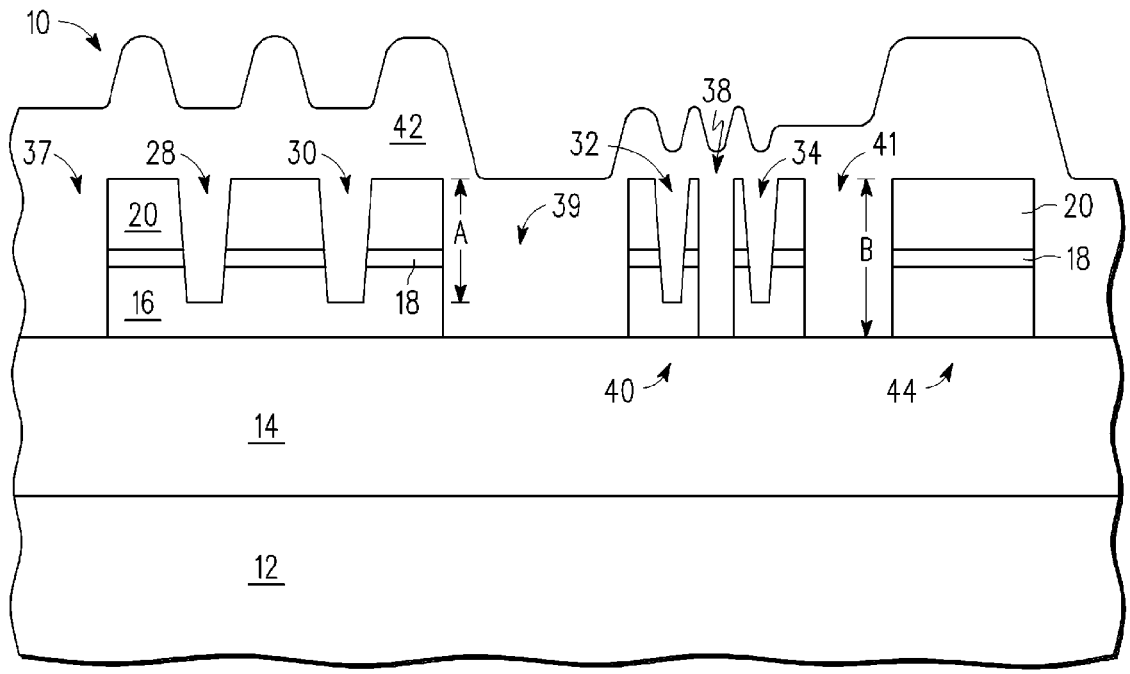
FIG. 5 illustrates a cross section of the semiconductor device structure at a subsequent processing stage.

FIG. 5 illustrates a cross section of the semiconductor device structure 10 after a conventional trench fill operation to fill trenches 28, 30, 32, 34, 37, 38, 39, and 41 with, preferably, high density plasma (HDP) oxide 42. In other embodiments, a different type of oxide may be used.

Figure 6:
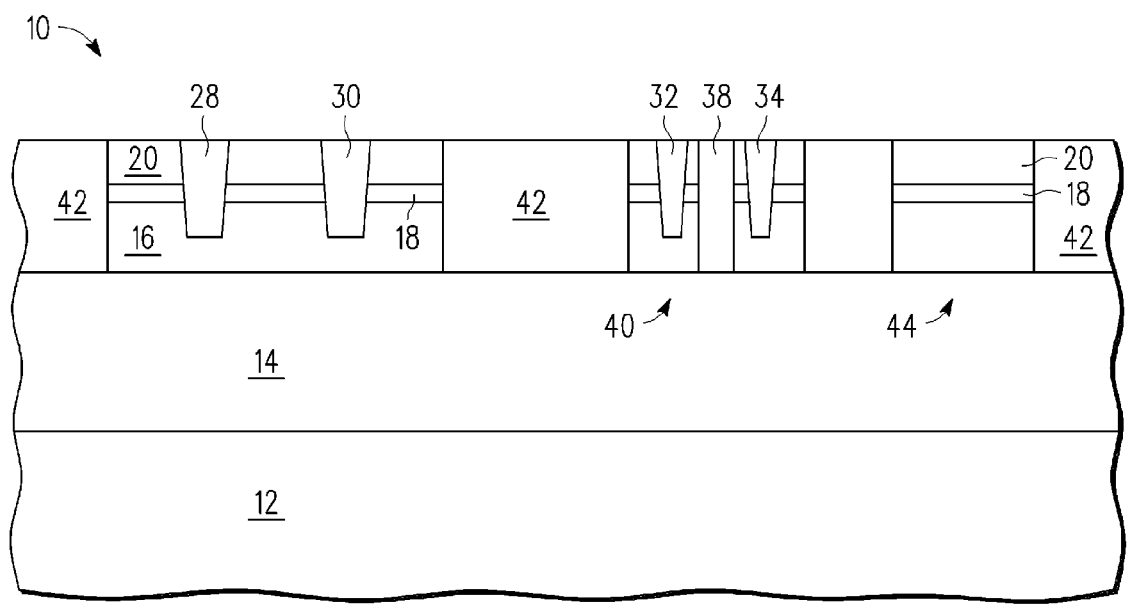
FIG. 6 illustrates a cross section of the semiconductor device structure at a subsequent processing stage.
Figure 12:
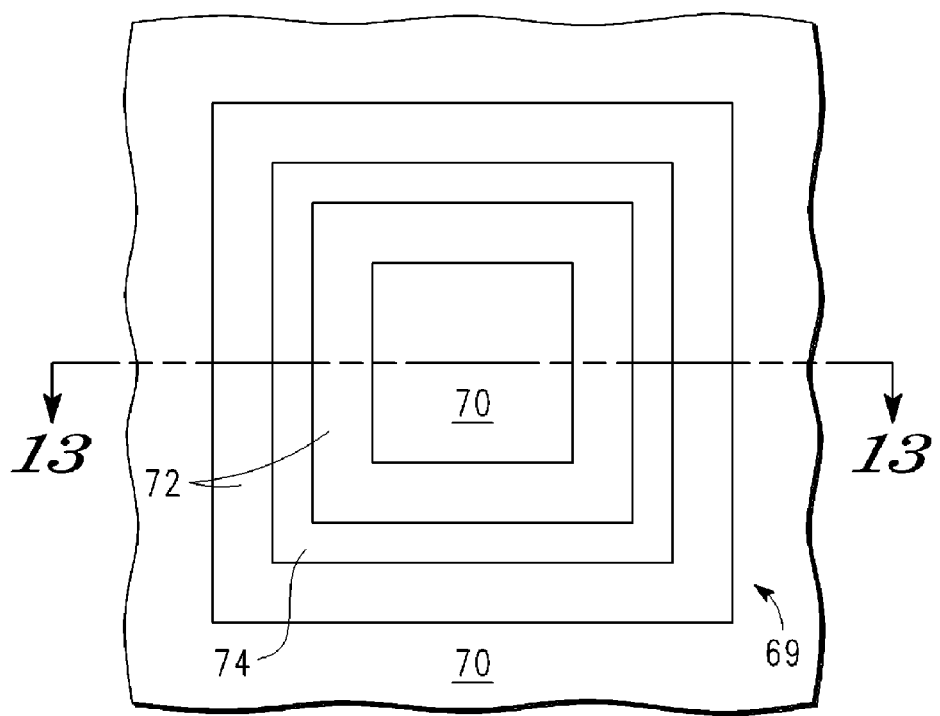
FIG. 12 illustrates a top down view of a semiconductor device in accordance with a fourth embodiment.

FIG. 6 illustrates a cross section of the semiconductor device structure 10 after the oxide 42 is removed down to nitride 20. Oxide 42 is removed using a conventional CMP process step. As illustrated in FIG. 6, some of nitride 20 is removed as well. Tile feature 40 aids in insuring planarization of device 10 as well as the other described functions. A top down view of a tile feature similar to tile feature 40 is illustrated in FIG. 12.

Figure 7:
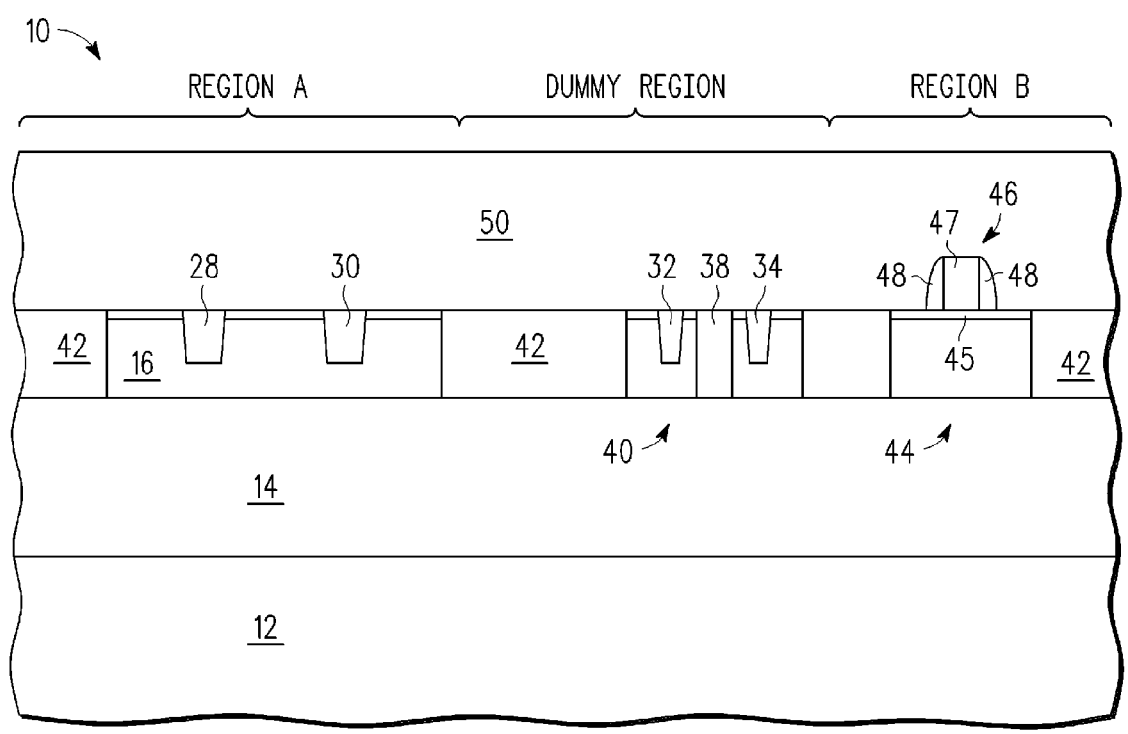
FIG. 7 illustrates a cross section of the semiconductor device structure at a subsequent processing stage.

FIG. 7 illustrates a cross section of the semiconductor device structure 10 after the rest of nitride 20 is removed. Nitride 20 is removed using a wet etch process. The pad oxide 18 is then removed. Electronic elements such as transistors will be fabricated on structure 44 in REGION B using standard semiconductor processing techniques. By way of example, a single FET (field effect transistor) 46 is shown on structure 44. A gate dielectric 45 is grown or deposited over the entire electronic region REGION B by a first thick gate thermal oxidation followed by a strip or patterned strip and then followed by a subsequent or multiple repetitions of gate oxidations depending upon the specific electronic or optical device needs. The transistor 46 includes a gate electrode 47 and sidewall spacers 48. Generally, the gate electrode 47 is formed over the gate dielectric 45 and sidewall spacers 48 are formed on the sides of gate electrode 46. Source and drain regions are diffused into semiconductor layer 16 (not shown). An interlevel dielectric (ILD) layer 50 is then formed over semiconductor device 10. Openings (not shown) are formed in ILD layer 50 to allow electrical contacts to be formed with the active devices below. Conductors (not shown) are formed on ILD layer 50 using, for example, aluminum, copper, or other type of conductive material. Additional ILD and conductive layers can be formed as needed.

The completed tile feature 40 is used to improve the planarity of the surface of a semiconductor device during a planarization step during manufacture of a semiconductor device from a semiconductor wafer.

Figure 8:
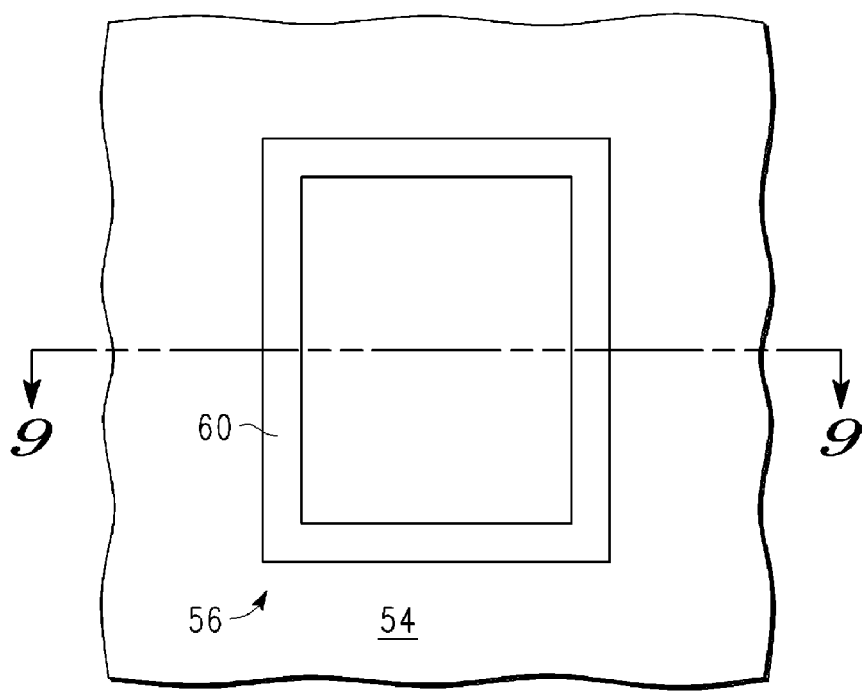
FIG. 8 illustrates a top down view of a semiconductor device in accordance with a second embodiment.
Figure 9:
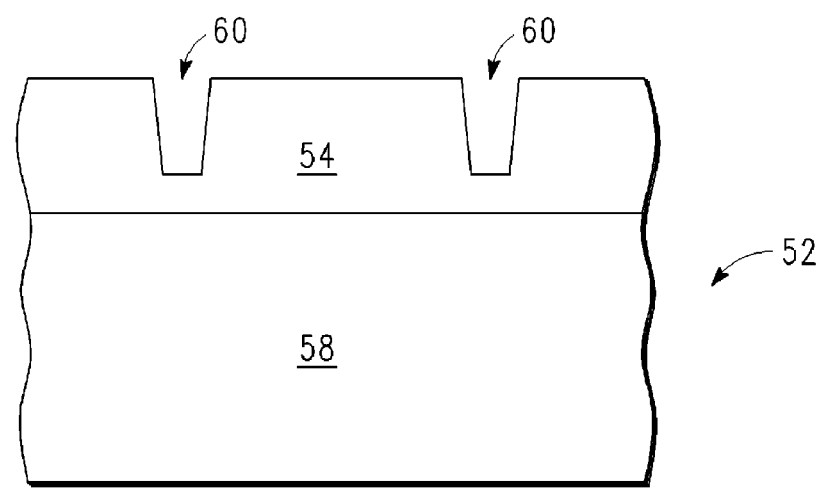
FIG. 9 illustrates a cross section of the semiconductor device of FIG. 8.

FIG. 8 illustrates a top down view of a portion 52 of a semiconductor device in accordance with a second embodiment. FIG. 9 illustrates a cross section of the portion 52 of FIG. 8. Portion 52 includes a ring-shaped tile feature 56. Tile feature 56 is representative of a plurality of tile features that may be formed on a semiconductor device using the same negative mask used to form, for example, the trenches of REGION A in FIG. 7. Tile feature 56 may be implemented, for example, on semiconductor device 10 of FIGS. 1-7.

Tile feature 56 includes a trench 60 formed in a generally rectangular shape, as illustrated in FIG. 8, although other shapes are possible. For example, tile feature 56 may be circular. Trench 60 is formed in a semiconductor layer 54 in a manner similar to the formation of trenches 28, 30, 32, and 34 using a negative tone photomask as described above regarding FIGS. 1-7. Semiconductor layer 54 is shown over an insulating layer 58. Pad oxide and nitride layers may be formed on semiconductor layer 54 and are not shown for the purpose of simplicity. Trench 60 is sized to enclose a predetermined amount of surface area. The amount of enclosed surface area depends on a number of factors, such as, the number of tile features desired on the semiconductor device and the percentage of open area needed on the negative tone photomask. The depth of trench 60 is determined by, and depends on, the depth of other trenches in the semiconductor device that are formed concurrently with the same negative tone photomask, such as the optical waveguides described above. Tile feature 56 is used to improve etching results, such as for example, the etching stability of the critical dimension across a wafer.

Generally, a tile is ring shaped if, from a three dimensional perspective, the tile takes the shape of a ring or donut. A tile is rectangular shaped if, from a three dimensional perspective, the tile does not form a ring, or in other words, the shape is solid or at least partially filled when the ring is a trench. The tile feature 56 illustrated in FIGS. 8 and 9 is an example of a ring shaped tile feature.

Figure 10:
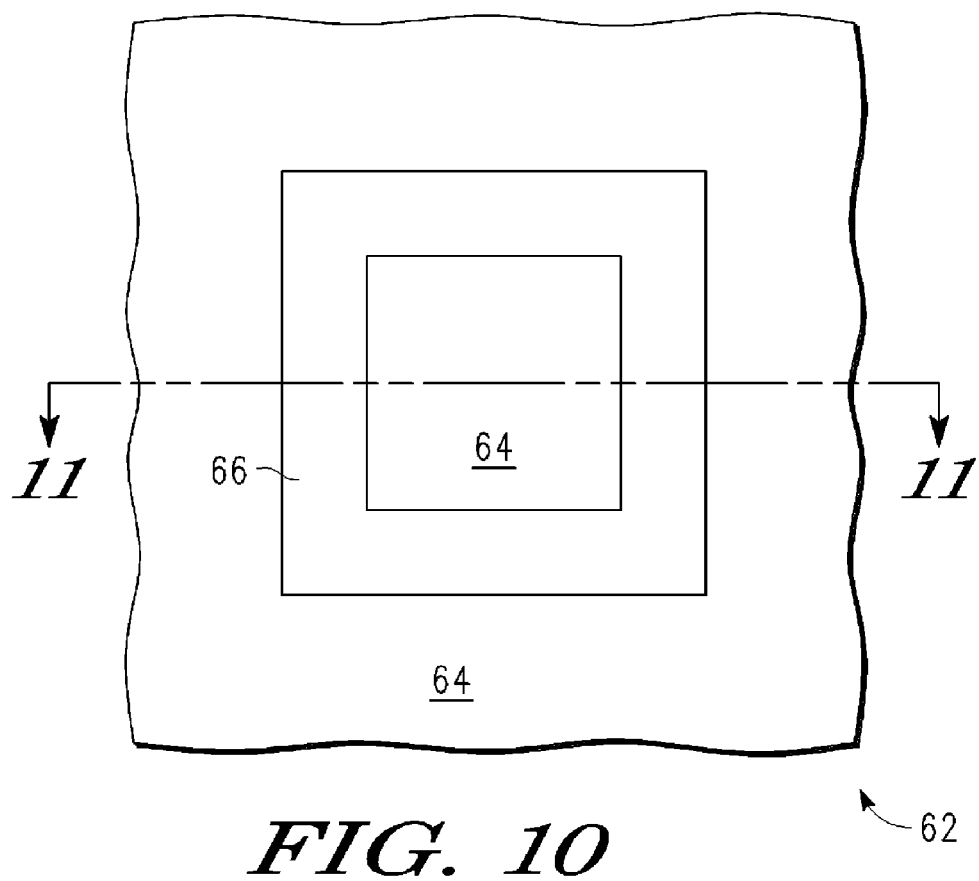
FIG. 10 illustrates a top down view of a semiconductor device in accordance with a third embodiment.
Figure 11:
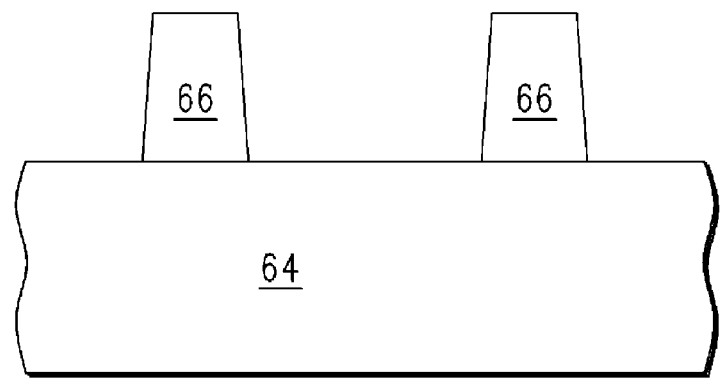
FIG. 11 illustrates a cross section of the semiconductor device of FIG. 10.

FIG. 10 illustrates a top down view of a portion 62 of a semiconductor device in accordance with a third embodiment. FIG. 11 illustrates a cross section of the portion 62 of FIG. 10. Portion 62 includes another ring shaped tile 66 formed on an insulating layer 64. Tile 66 is representative of a plurality of tile that may be formed on a semiconductor device, such as semiconductor device 10 of FIGS. 1-7. Tile 66 is formed using a positive tone photomask as described above to pattern tile feature 40 of region DUMMY REGION from a semiconductor layer such as semiconductor layer 16 of FIGS. 1-7. Tile feature 66 is generally ring-shaped and encloses a predetermined surface area. Note that the length of the sides of the tile features can vary. Tile feature 66 is square shaped when viewed in the top down perspective of FIG. 10. Other shapes are possible, for example, tile feature 66 may be circular in other embodiments. The enclosed surface area depends on factors, such as for example, the number of tile features desired on the semiconductor device and the percentage of open area needed on the positive tone photomask. Pad oxide and nitride layers may be formed on the semiconductor layer and are not shown for the purpose of simplicity. The height of tile feature 66 is approximately equal to the thickness of the semiconductor layer from which tile feature 66 is formed. The tile feature 66 is used to improve the planarity of the surface of a semiconductor device during a planarization step during manufacture of a semiconductor device from a semiconductor wafer.

Figure 13:
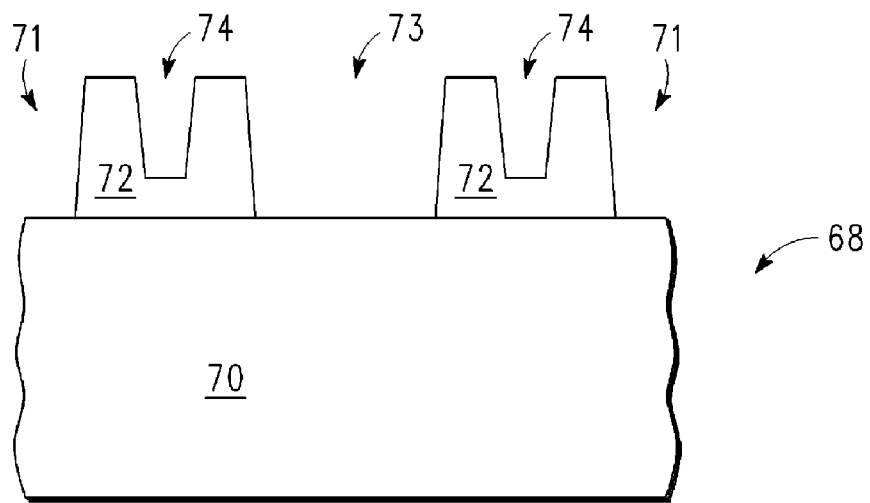
FIG. 13 illustrates a cross section of the semiconductor device of FIG. 12.
Figure 14:
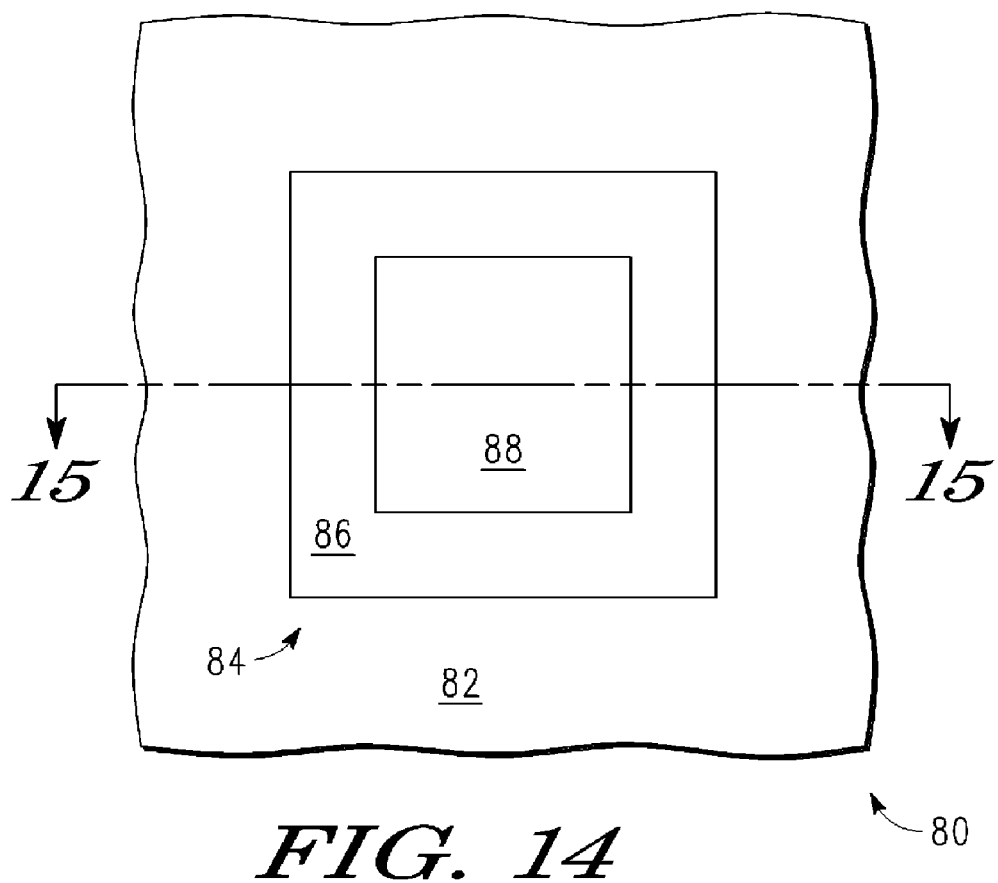
FIG. 14 illustrates a top down view of a semiconductor device in accordance with a fifth embodiment.

FIG. 12 illustrates a top down view of a portion 68 of a semiconductor device in accordance with a fourth embodiment. FIG. 13 illustrates a cross section of the portion 68 of FIG. 12. Portion 68 includes a ring-shaped composite tile 69 formed on an insulating layer 70 of a semiconductor device. The tile is "composite" because both trenches of a dual trench process are used to create the tile. Tile feature 69 is representative of a plurality of tile features that may be formed on a semiconductor device, such as semiconductor device 10 of FIGS. 1-7. Note that the tile features of FIGS. 8-11 can be combined to produce other composite tile features. Also, tile feature 69 may be formed using the same dual-trench process as described above regarding tile feature 40, and is similar to tile feature 40. A negative tone photomask is used to create trench 74 in semiconductor layer 72 as described above regarding the DUMMY REGION of FIGS. 1-7. A positive tone photomask is used to remove portions of the semiconductor layer to produce a trench 71 as also described above regarding REGION B of FIGS. 1-7. Trench 71 is rectangular shaped and encloses a first predetermined surface area including trench 74. Trench 74 encloses a second predetermined surface area that is less than or equal to the first predetermined surface area. A third trench 73 is formed within trench 74 as illustrated in FIGS. 13 and 14. As described above regarding tile features 56 and 66, other shapes can be used in other embodiments. Pad oxide and nitride layers may be formed on the semiconductor layer and are not shown for the purpose of simplicity. Because tile feature 69 is formed using both the negative tone photomask and the positive tone photomask, it is used to improve the planarity of the surface of a semiconductor device during planarization as well as to improve etch stability and variations.

Figure 15:
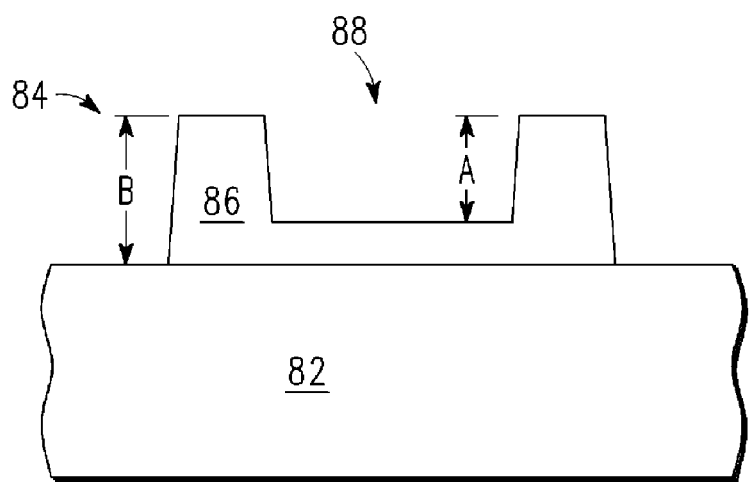
FIG. 15 illustrates a cross section of the semiconductor device in FIG. 14.

FIG. 14 illustrates a top down view of a portion 80 of a semiconductor device in accordance with a fifth embodiment. FIG. 15 illustrates a cross section of the portion 80 of FIG. 14. Portion 80 includes a composite tile 84 formed on insulating layer 82 of a semiconductor device. Generally, tile 84 includes tile features 86 and 88 and can be formed using the same dual-trench process described above regarding tile feature 40. A tile feature 86 is formed using a positive tone photomask to form a first trench having depth "B" on the outside of the defined boundary of tile feature 86 as described above to pattern tile feature 66. On the inside of tile feature 86 a second trench having depth "A" is formed. Depth "A" is less than depth "B" in the illustrated embodiment. In another embodiment, tile 84 may be formed using only the first trench, so that effectively, depth "A" in FIG. 15 is zero. Note that if depth "A" was made to be equal to depth "B", then tile feature 84 would be characterized as being "ring-shaped" instead of rectangular. Of course, when viewed only from a top down perspective, tile feature 84 appears rectangular regardless of the depth of trenches "A" and "B".

Figure 16:
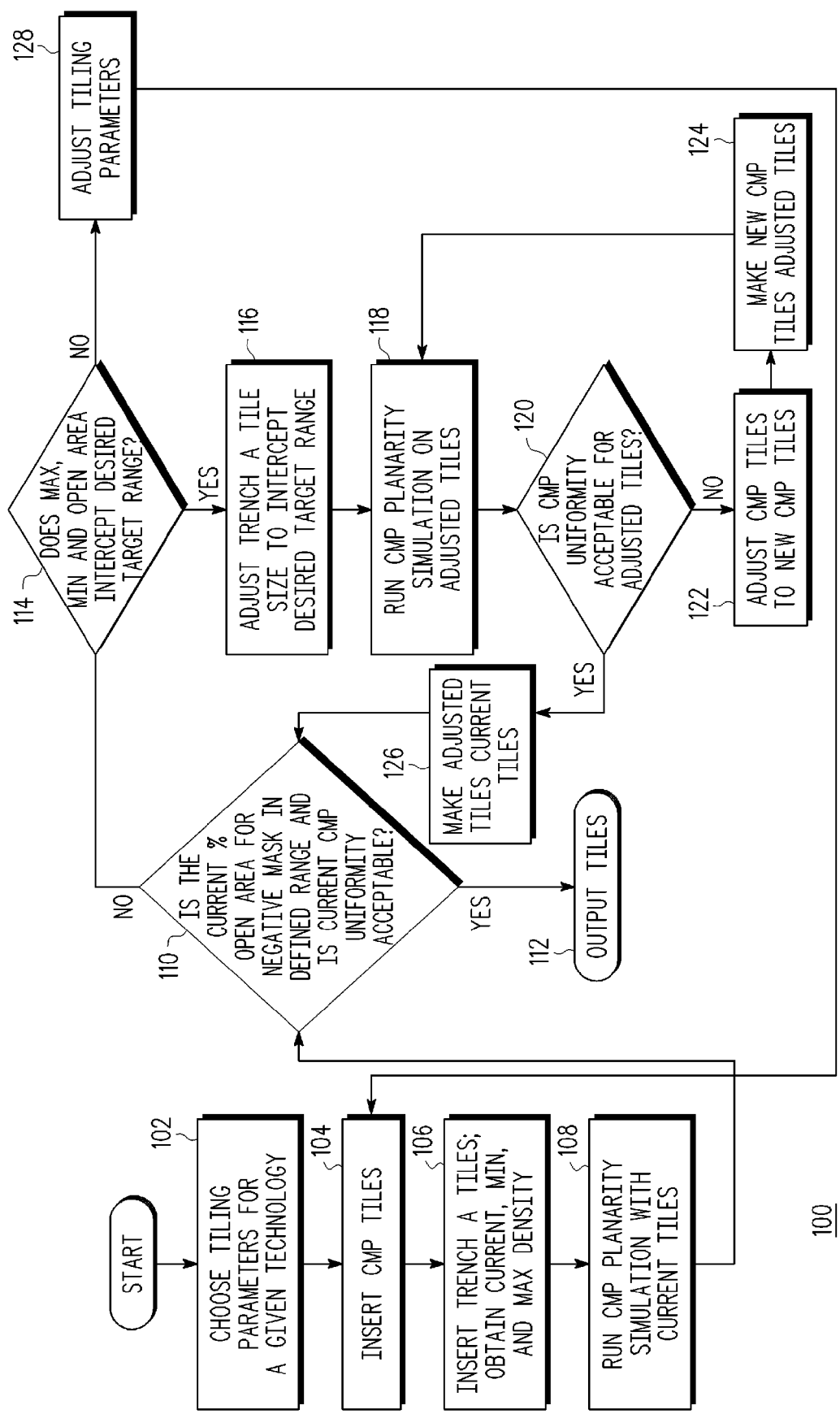
FIG. 16 illustrates a flow chart useful for understanding a method in accordance with a fifth embodiment.

FIG. 16 illustrates a flow chart 100 useful for understanding a method for tiling a semiconductor device formed using a dual trench process. The method begin at step 102, where tiling parameters for a given semiconductor process technology are chosen. The tiling parameters may include the minimum and maximum size of the tiles, and the feature density of the surface of the semiconductor device. At step 104, a computer model layout tool is used to insert CMP tile features into the design. The layout tool chooses tile locations based on the predefined tiling parameters. The CMP tile features may be, for example, a plurality of tile features 66 or 69. At step 106, optical-trench (TRENCH A) tiles are inserted into the semiconductor design. The optical-trench tiles are tile features formed using the same photomask that is used to form the optical features of a device having both optical and electronic elements. An example TRENCH A tile is tile feature 56 illustrated in FIGS. 8 and 9. Also, at step 106, the minimum and maximum tile feature sizes and feature density of the design including the currently inserted tile features are obtained and recorded. At step 108, a CMP planarity simulation is run using the currently inserted tile features. The CMP planarity simulation can be run using any commercially obtainable planarity simulation software program on any compatible computer system. At decision step 110, it is determined, after running the simulation, if the current percentage of open area of the negative tone photomask is within a defined range and if the current CMP uniformity result is acceptable. If the answer to both questions is yes, then the "YES" path is taken to step 112 and the tile features are output from the software program and used in manufacturing a semiconductor device. If, however, the answer to one or both questions is no, then the "NO" path is taken to decision step 114. At decision step 114, it is determined if the maximum tile feature size, minimum tile feature size, and percentage of open area are within a desired target range. If the answer is no, then the "NO" path is taken to step 128 and one or more of the tiling parameters are adjusted. The method then returns to step 104. However, if the YES path is taken from decision step 114 to step 116, then the TRENCH A tile size and the number of TRENCH A tile features are adjusted to cause the minimum tile feature size, the maximum tile feature size, and the percentage of open area to intercept the desired target range. At step 118, the CMP planarity simulation is rerun using the adjusted tile features. At decision step 120, it is determined if the CMP uniformity is acceptable using the adjusted tile features. If CMP uniformity is not acceptable, then the NO path is taken to step 122 and the CMP tiles are adjusted to create new CMP tiles. Note that the CMP tiles can be, for example, tile features 66 and/or 69. At step 124 the new CMP tiles are substituted for the adjusted tiles and the method returns to step 118 where the simulation is rerun with the new tiles. At decision step 120, if the CMP uniformity is acceptable for the adjusted tile features, then the YES path is taken to step 126. At step 126, the adjusted tile features are used as the current tiles and decision step 110 is repeated. Multiple iterations of method 100 may be needed to produce acceptable simulation results.

By now it should be appreciated that there has been provided, a negative tone photomask tile feature and method for tiling in a dual trench process that improves stability of the etched critical dimension, reduces variations between masksets, without harming CMP performance.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

The term "program," as used herein, is defined as a sequence of instructions designed for execution on a computer system. A program, or computer program, may include a subroutine, a function, a procedure, an object method, an object implementation, an executable application, an applet, a servlet, a source code, an object code, a shared library/dynamic load library and/or other sequence of instructions designed for execution on a computer system.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method for forming a semiconductor device, the method comprising:
   providing a semiconductor substrate having a first region and a second region, the first region for having one or more first elements and the second region for having one or more second elements, the first elements being different from the second elements;

defining a tile location and a first tile surface area for a tile feature on the semiconductor device;

forming an active semiconductor layer over both the first region and the second region of the semiconductor substrate;

forming a first trench in the active semiconductor layer at the tile location using a negative tone photomask, the first trench having a first depth and forming at least a portion of the tile feature, the first trench enclosing a second tile surface area of the semiconductor device less than or equal to the first tile surface area;

forming a second trench in the active semiconductor layer using a positive tone photomask, the second trench having a second depth different than the first depth;

forming a third trench at the tile location, the third trench being formed to the second depth at the same time as the second trench with the positive tone photomask, the third trench surrounding the first trench;

filling the first and second trenches with a fill material; and chemical mechanical polishing (CMP) the semiconductor device.

2. The method of claim 1, wherein forming the first trench further comprises forming an optical element in the first region using the negative tone photomask.

3. The method of claim 1, wherein the enclosed second tile surface area is rectangular shaped.

4. The method of claim 3, wherein forming the second trench further comprises forming a third trench at the tile location within the enclosed second tile surface area of the first trench, the third trench being formed to the second depth at the same time as the second trench and with the positive tone photomask.

5. The method of claim 1, wherein the first element is an optical element and the second element is an electronic element.

6. The method of claim 1, wherein defining the tile location and the first tile surface area for the tile feature further comprises:

inserting a plurality of the tile features into a computer model layout of the semiconductor device;

running a first CMP planarity simulation of the computer model layout;

determining if a percentage of open area of the negative tone photomask is within a predetermined range;

determining if a result of the chemical mechanical polishing planarity simulation is favorable;

adjusting the first tile surface area in the plurality of the tile features of the computer model layout based, at least in part, on an outcome of the first CMP planarity simulation;

running a second CMP planarity simulation of the computer model layout with the adjusted first tile surface area; and determining that CMP uniformity of the second CMP planarity simulation is acceptable.

7. The method of claim 1, further comprising:

forming a transistor in the second region; and forming an interlevel dielectric layer over the semiconductor device.

8. A method for forming a semiconductor device, the method comprising:

providing a semiconductor substrate having an optical element region and an electronic element region;

defining a tile feature for the semiconductor device;

defining a tile location for the tile feature on the semiconductor device;

forming an active semiconductor layer over both the optical element region and the electronic element region of the semiconductor substrate;

forming an insulating layer over the active semiconductor layer;

forming a layer comprising nitride over the insulating layer;

forming a first trench in the active semiconductor layer at the tile location using a negative tone photomask, the first trench having a first depth, forming at least a portion of the tile feature, and enclosing a tile surface area on a surface of the semiconductor device;

forming a second trench in the active semiconductor layer using a positive tone photomask, the second trench having a second depth that is deeper than the first depth;

forming a third trench at the tile location, the third trench being formed to the second depth at the same time as the second trench with the positive tone photomask, and the third trench surrounding the first trench;

filling the first and second trenches with a fill material; and chemical mechanical polishing (CMP) the surface of the semiconductor device.

9. The method of claim 8, wherein defining a tile location for a tile feature further comprises:

determining a size of the tile feature;

inserting a plurality of the tile features into a computer model layout of the semiconductor device;

running a first CMP planarity simulation of the computer model layout;

determining if a percentage of open area of the negative tone photomask is within a predetermined range;

determining if a result of the chemical mechanical polishing planarity simulation is favorable;

adjusting the size of each of the plurality of the tile features of the computer model layout based, at least in part, on an outcome of the first CMP planarity simulation;

running a second CMP planarity simulation of the computer model layout with the adjusted size; and determining that CMP uniformity of the second CMP planarity simulation is acceptable.

10. The method of claim 8, wherein forming the first trench further comprises forming a waveguide trench in the optical element region using the negative tone photomask.

11. The method of claim 8, wherein the enclosed tile surface area is rectangular shaped.

12. The method of claim 8, wherein forming the second trench further comprises forming a third trench at the tile location within the enclosed tile surface area of the first trench, the third trench being formed to the second depth at the same time as the second trench and with the positive tone photomask.

* * * * *